(12) United States Patent
Kuo et al.

(10) Patent No.: US 6,894,340 B2
(45) Date of Patent: May 17, 2005

(54) NON-VOLATILE SEMICONDUCTOR MEMORY CELL UTILIZING POLY-EDGE DISCHARGE

(75) Inventors: Tung Chen Kuo, Lo-Tung I-Lan (TW); Hsiang Lan Lung, Hsinchu (TW)

(73) Assignee: Macronix International, Hsinchu (TW)

( * ) Notice: Subject to any disclaimer, the term of this patent is extended or adjusted under 35 U.S.C. 154(b) by 36 days.

(21) Appl. No.: 09/861,284

(22) Filed: May 18, 2001

(65) Prior Publication Data

US 2002/0105023 A1 Aug. 8, 2002

(30) Foreign Application Priority Data

Feb. 2, 2001 (TW) ........................................ 90102145 A (51) Int. Cl.[7] ...................... H01L 29/788; H01L 21/336
(52) U.S. Cl. ........................ 257/315; 257/314; 438/262
(58) Field of Search ................................ 257/314–321, 257/324; 385/185.24; 438/201, 260–262

(56) References Cited

U.S. PATENT DOCUMENTS

| | | | |
|---|---|---|---|
| 5,063,172 A | | 11/1991 | Manley |
| 5,618,742 A | | 4/1997 | Shone et al. |
| 5,656,845 A | * | 8/1997 | Akbar ........................ 257/347 |

(Continued)

OTHER PUBLICATIONS

S. Wolf and R. N. Tauber, "Silicon Processing for the VLSI Era", vol. 1—Process Technology, Second Edition; Lattice Pres Sunset Beach, CA (ISBN: 0–9616721–6–1) (2000); particularly: p. 265.*

"The evolution of IBM CMOS DRAM technology," by E. Adler et al., *IBM Journal of Research and Development*, vol. 39, No. 12, 1995, printed from the following website: http://www.research.ibm.com/journal/rd/391/adler.html, 27 pgs.

"Embedding Flash Memory in SOC Applications," by Ilan Bloom et al., *Integrated System Design*, article printed from the following website on Feb. 7, 2001: http://www.isdmag-.com/editorial/2000/applications0012.html, 5 pgs.

"Saifun, Tower demonstrate new performance capabilities on flash–memory front," copy of news article printed in *Semiconductor Business News* on Oct. 16, 2000, and printed from the following website on Jan. 30, 2001: http://www-.siliconstrategies.com/story/OEG2000100620010, 2 pgs.

Various Internet pages printed from the following website: http://www.saifun.com, *Saifun Semiconductors Ltd.*; pages printed on Jan. 30, 2001, 7 pgs.

*Primary Examiner*—Nathan J. Flynn
*Assistant Examiner*—Johannes Mondt
(74) *Attorney, Agent, or Firm*—Workman Nydegger (57) ABSTRACT

A process and structure for fabricating a non-volatile memory cell through the formation of a source and drain region and a charge trapping layer located therebetween is presented. E-fields for generating trapped charges are formed through using poly-edge discharge techniques wherein the gate structures of the memory cells are laterally separated from the vertical region of the source and drain regions. The gate structure forms a laterally directed e-field through the charge trapping layer to one of the source and drain regions which enables the charge to be trapped and retained in an area that is lateral to the source and drain regions. Lateral separation of the gate from the source and drain regions is maintained through the use of spacers which may take the form of insulated polysilicon structures or in an alternate embodiment may take the form of insulating spacers located on the sidewalls of the gate structure.

15 Claims, 7 Drawing Sheets

U.S. PATENT DOCUMENTS

| | | | |
|---|---|---|---|
| 5,760,644 A | 6/1998 | Lancaster et al. | |
| 5,768,192 A | 6/1998 | Eitan | |
| 5,836,772 A | 11/1998 | Chang et al. | |
| 5,841,700 A | 11/1998 | Chang | |
| 5,889,700 A * | 3/1999 | Bergemont et al. | 365/185.18 |
| 5,969,383 A * | 10/1999 | Chang et al. | 257/316 |
| 6,005,809 A | 12/1999 | Sung et al. | |
| 6,083,792 A | 7/2000 | Sung | |
| 6,103,576 A * | 8/2000 | Deustcher et al. | 438/261 |
| 6,166,958 A * | 12/2000 | Naruke et al. | 365/185.24 |
| 6,177,311 B1 * | 1/2001 | Kauffman et al. | 438/257 |
| 6,248,628 B1 * | 6/2001 | Halliyal et al. | 438/257 |
| 6,255,205 B1 * | 7/2001 | Sung | 438/595 |
| 6,269,023 B1 * | 7/2001 | Derhacobian et al. | 365/185.24 |
| 6,331,952 B1 * | 12/2001 | Wang et al. | 365/185.29 |
| 6,649,972 B2 * | 11/2003 | Eitan | 257/324 |
| 2002/0005545 A1 * | 1/2002 | Widdershoven et al. | 257/314 |

* cited by examiner

NON-VOLATILE SEMICONDUCTOR MEMORY CELL UTILIZING POLY-EDGE DISCHARGE

BACKGROUND OF THE INVENTION

1. The Field of the Invention

The present invention relates generally to semiconductor memory devices and more particularly to programmable memory devices.

2. The Background of the Invention

Non-volatile memory storage devices have become very ubiquitous in modern electronic applications. Non-volatile memories include read only memory (ROM) and various programmable and erasable variations therefrom, including programmable read only memory (PROM), erasable and electrically erasable programmable read only memory and other higher speed derivations therefrom. Another type of memory device includes a flash EPROM which has the capability of electrically erasing, programming, and reading a memory cell within the memory device.

A memory cell formed within a traditional flash EPROM has been traditionally formed using floating gate transistors, in which the data is stored in a cell by charging or discharging the floating gate. The floating gate has traditionally been comprised of conductive materials such as polysilicon which is insulated from the channel located between the drain and source of the transistor by a thin layer of insulative oxide or other insulating material. Under this traditional floating gate approach, data is stored in the memory cell by charging or discharging the floating gate. The floating gate is charged by applying a large positive voltage between the gate and the source or drain. Such an approach relies on the electron tunneling mechanism for storing the charge in the gate.

Alternatively, potentials such as electrical voltages may be applied to induce high energy electrons in the channel of a cell which are injected across the insulator of the floating gate. Such an alternative approach employs an avalanche mechanism for storing the charge within the floating gate. The voltage on the control gate or word line when divided by the coupling ratio of the memory cell results in a first voltage between the control gate and floating gate and a second voltage between the floating gate and the source or drain. An exemplary calculation of a 50% coupling ratio implies that half of the voltage applied to the control gate appears across the oxide between the floating gate and the source or drain. Such a voltage between the floating gate and the source or drain causes electrons to tunnel or to be injected into the floating gate through the thin insulator. When the floating gate is charged, the threshold voltage for causing the memory cell to conduct is increased above the voltage applied to the word line during a read operation. Thus, when the charged cell is addressed during a read operation, the cell does not conduct. The non-conducting state of the cell can be interrupted as a binary 1 or a 0, depending on the polarity of the sensing circuit.

In order to establish the opposite memory state, the floating gate is discharged through a typical tunneling process between the floating gate and the source or drain of the transistor, or between the floating gate and the substrate. That is to say, the floating gate may be discharged through the source by establishing a large positive voltage from the source to the gate while the drain is left at a floating potential. The high voltages used to charge and discharge a floating gate place significant design restrictions on flash memory devices, particularly as the cell dimensions and process specifications are reduced in size. Thus, the coupling ratio for the memory cells becomes a critical design parameter.

Figure 1:
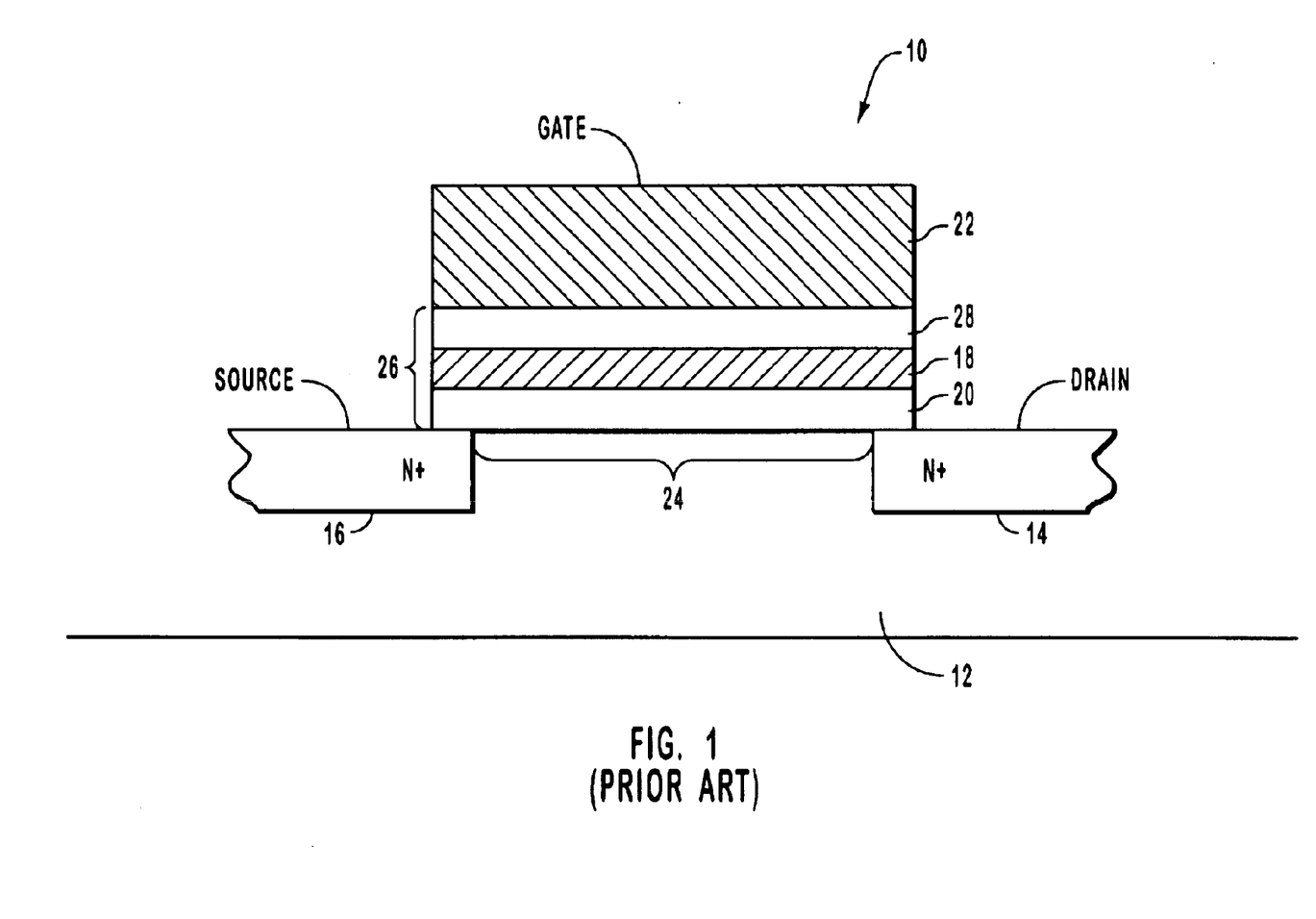
FIG. 1 illustrates a sectional view of a memory cell of the prior art utilizing ONO trapping material that extends over into the source and drain regions of the memory cell.

Memory cell designs, other thin those employing a floating gate, have been proposed. For example, ONO EPROM memory cells employ a trapping dielectric architecture as depicted in FIG. 1. The memory cell 10 includes a P-type silicon substrate 12 with an N+ drain 14 and an N+ source 16 implanted therein. In place of a traditional gate oxide, a non-conducting composite comprised of an oxide layer 28, a nitride layer 18, and another oxide layer 20, separate the polysilicon gate 22 from the channel 24. Oxide layer 28, nitride layer 18, and oxide layer 20 combine to form the ONO layer 26. It should be further pointed out that ONO layer 26 intentionally extends beyond the length of channel 24 out into the regions overlapping drain 14 and source 16. Such an overlap enables the trapping of the charge during the programming process as described below.

ONO memory cell 10 is programmed or written to by applying voltages to drain 14 and gate 22 while simultaneously grounding source 16. By way of example, a 10 volt potential may be applied to gate 22 with a 9 volt potential applied to drain 14. Such voltages generate electrical fields causing an inversion in channel 24 from source 16 to drain 14. Such a difference in potential in the presence of the electrical field causes electrons to migrate from source 16 and begin accelerating toward drain 14. In the migration toward drain 14 they gain energy and eventually gain sufficient energy to pass through oxide layer 20 and become trapped in nitride layer 18. The probability of such electrons traversing oxide layer 20 is maximized when there energy is also which occurs in a concentrated region nearest drain 14. Such high energy electrons, also known as hot electrons, become trapped in nitride layer 18 and remain concentrated or stored therein. Because nitride layer 18 is largely nonconductive, the electrons in nitride layer 18 do not spread throughout nitride layer 18 and remain in the localized trapping region near drain 14. It should be recalled that this is in contrast to memory cells implemented using floating gate technology wherein the retained charge is not locally trapped but rather distributed evenly across the entire gate region. Because of this distribution, the threshold for the entire gate increases as more charge is retained by the gate.

In contrast, for memory cells implemented according to FIG. 1 using a nitride layer or other similar low or nonconductive materials, the gate threshold voltage is altered only in the localized charge-trapping region. In both the floating gate or conductive gate implementation as well as in the low or nonconductive gate memory cell designs, an increase in the gate threshold voltage causes the current flowing through the channel to decrease. Such a reduction increases the programming time necessary for injecting an identifiable charge into the charge trapping region. In a ONO memory cell design, the programming time is reduced due to the localized charge trapping that is possible in a conductive floating gate memory cell implementation.

While the overlapping of the ONO composite 26 into the drain 14 and source 16 regions results in the creation of an e-field in the overlapping regions that enables charge trapping as described above, it would be desirable to provide a memory cell architecture that reduces the program and erase voltages and current necessary for trapping charge that is retainable and readable as a logic level.

BRIEF SUMMARY OF THE INVENTION

A non-volatile memory cell is presented that incorporates a phenomenon known as poly-edge discharge which creates an enhanced e-field which is very beneficial for the trapping of charges in a memory device. In one embodiment of the present invention, a non-volatile memory cell is comprised of source and drain regions formed within a semiconductor substrate. The source and drain regions are separated with an ONO charge trapping layer located at least partially between the source and drain regions.

In a direction generally laterally from the source and drain planar regions, a gate is formed that has an edge or point from which the e-field is generated. The gate is generally in a location lateral from the source and drain regions such that any charge to be trapped is done so in a region lateral as opposed to vertically above a source or drain region. In one embodiment, the gate structure is maintained or formed lateral to the source and drain regions through the use of a spacer which may typically be comprised of insulative materials such as an oxide or a silicon nitride material that is insulated from the gate. In one embodiment the spacer is comprised of polysilicon material which is surrounded by insulative oxide.

In another embodiment, the charge trapping layer is formed between the drain and source regions and may even extend over the source and drain regions with the gate being located, preferably central between the source and drain regions. In order to ensure that the gate does not overlap the source and drain regions, nonconductive or insulative spacers are formed on the sidewall of the gate such that the gate does not extend through the entire length of the channel region between the source and drain regions. Such insulative sidewall spacers induces the lateral e-field through the charge trapping layer such that the charge may be trapped in a region that is lateral to the source and drain areas.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

FIG. 2 depicts the fabrication of a memory cell structure, in accordance with a preferred embodiment of the present invention. In FIG. 2A, a semiconductor substrate 100 is prepared by forming a doped P-well 102 in semiconductor substrate 100. A dielectric composite or trapping region is thereafter developed which consists of a three-layer stack of dielectrics (ONO) 104 consisting of a bottom layer of silicon dioxide 94, a middle layer of silicon nitride ($Si_3N_4$) 96, and a top layer of silicon dioxide 98. The outside layers in ONO 104 may either be thermally grown or in the case of the silicon nitride, it may be deposited as a film. While the thicknesses of each component of ONO layer 104 may be varied depending upon the specific process employed, acceptable values for the top layer of oxide 98 may include 90 Å, with the nitride layer 96 assuming a thickness of approximately 20 Å, and the lower level oxide 94 assuming a thickness of approximately 70 Å.

Figure 2A:
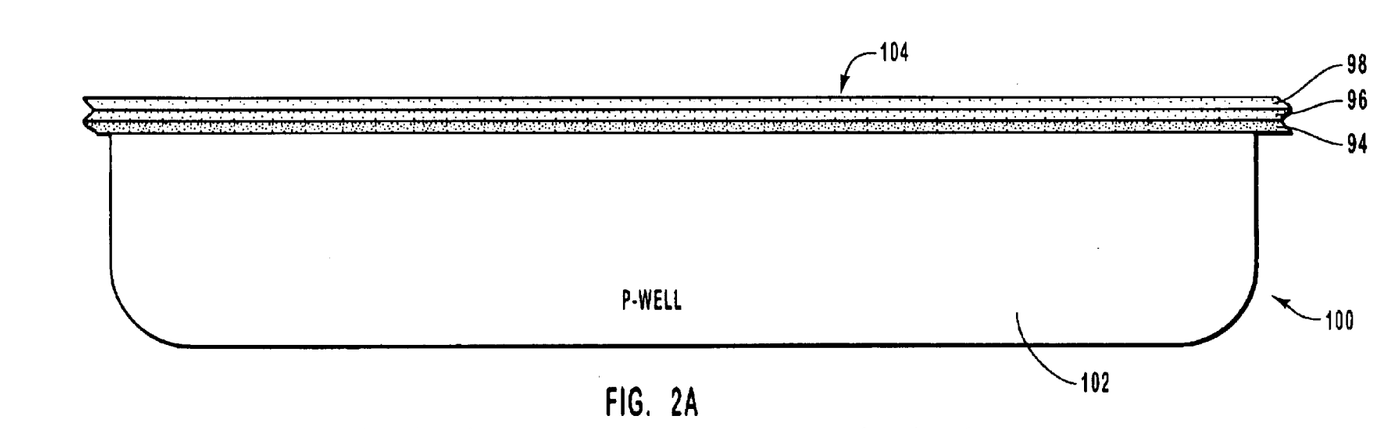
FIGS. 2A-2G illustrate the fabrication and structure of a memory cell having storage regions within the ONO layer that are adjacent to the source and drain regions that utilize poly-edge discharge techniques, in accordance with a preferred embodiment of the present invention.

It should be recalled that the nitride layer 96 within ONO 104 is a nonconductor and forms the memory retention layer which functions to trap electrons or charge as they become injected therein. As a nonconductor, the nitride layer retains the trapped charge in the localized area and does not distribute it evenly throughout as is the case in floating gate technology.

Figure 2B:
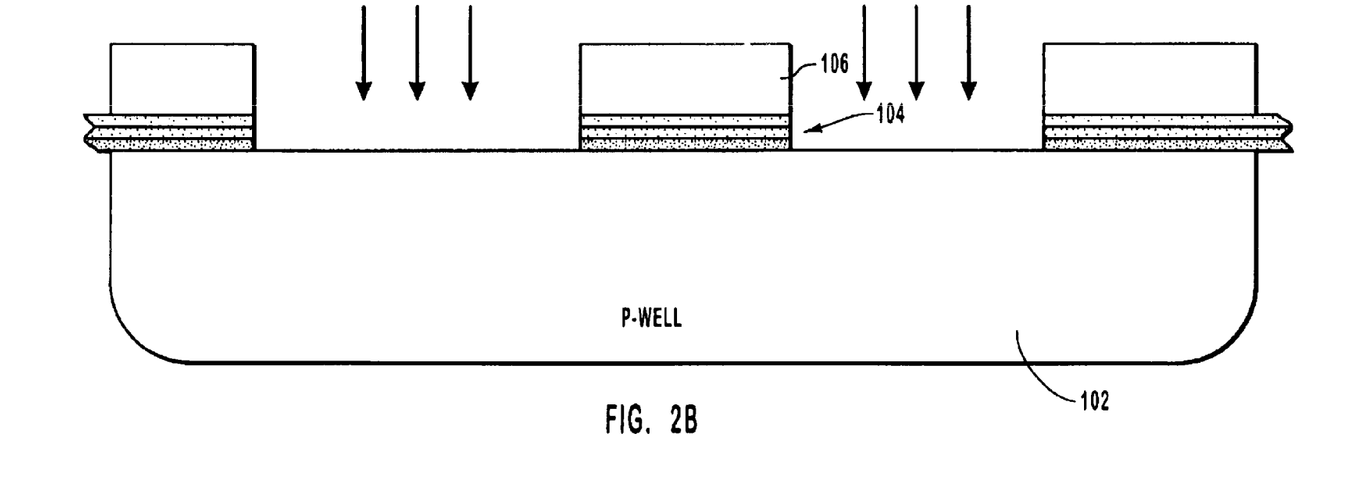

In FIG. 2B, photoresist 106 is applied using a traditional photo etching process wherein photoresist 106 is applied as a mask for etching ONO layer 104 for the formation of buried drain/source. The photoresist 106 is removed to facilitate diffusion processes for fabricating the source and drain regions of the memory cell. The fabrication of a source 110 and a drain 112, using an N+ implant, defines the boundaries of the memory cell, in accordance with the preferred embodiment of the present invention.

Figure 2C:
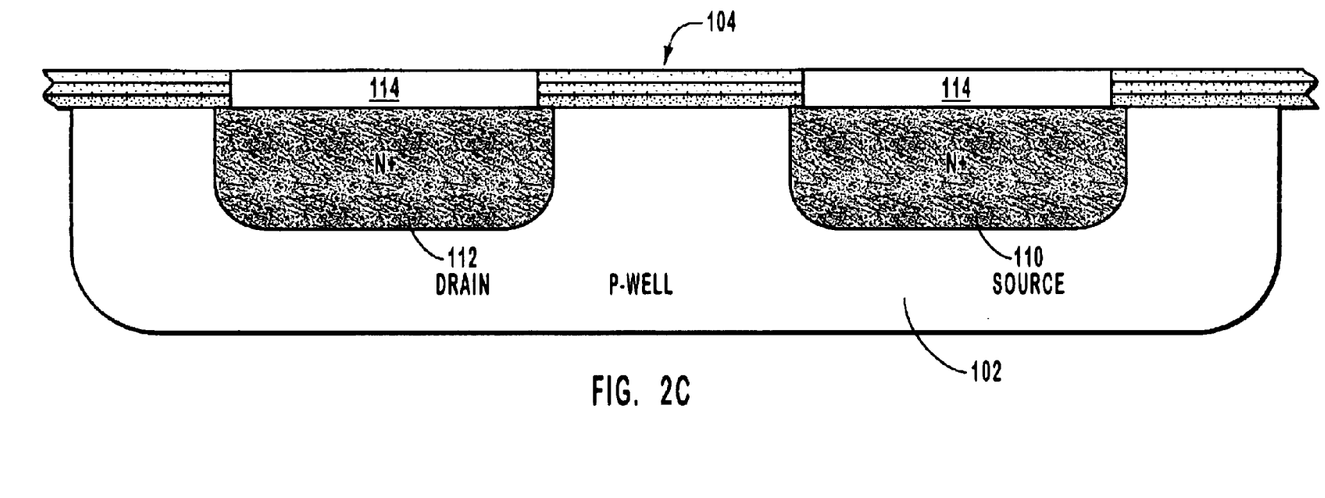
Figure 2D:
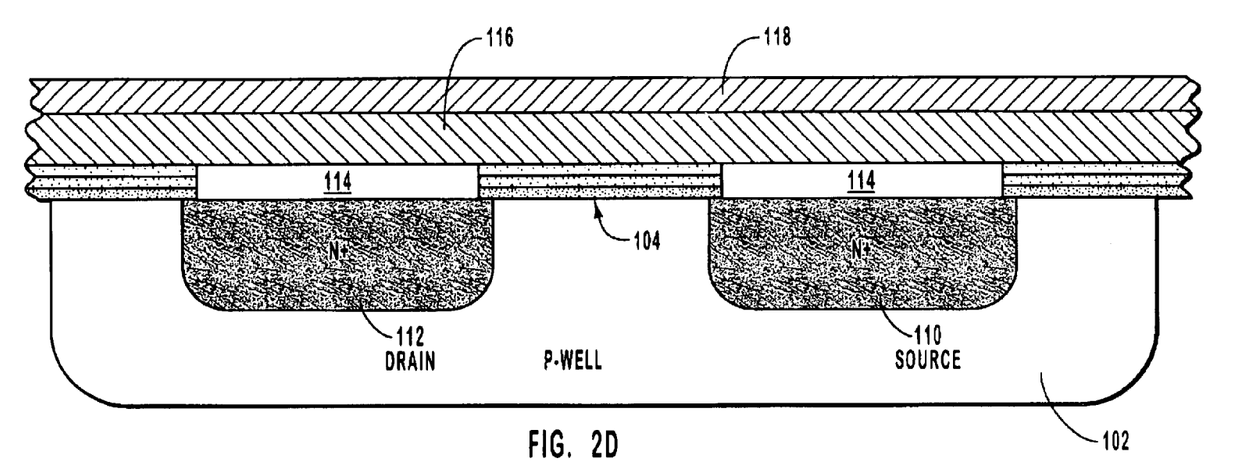
Figure 2E:
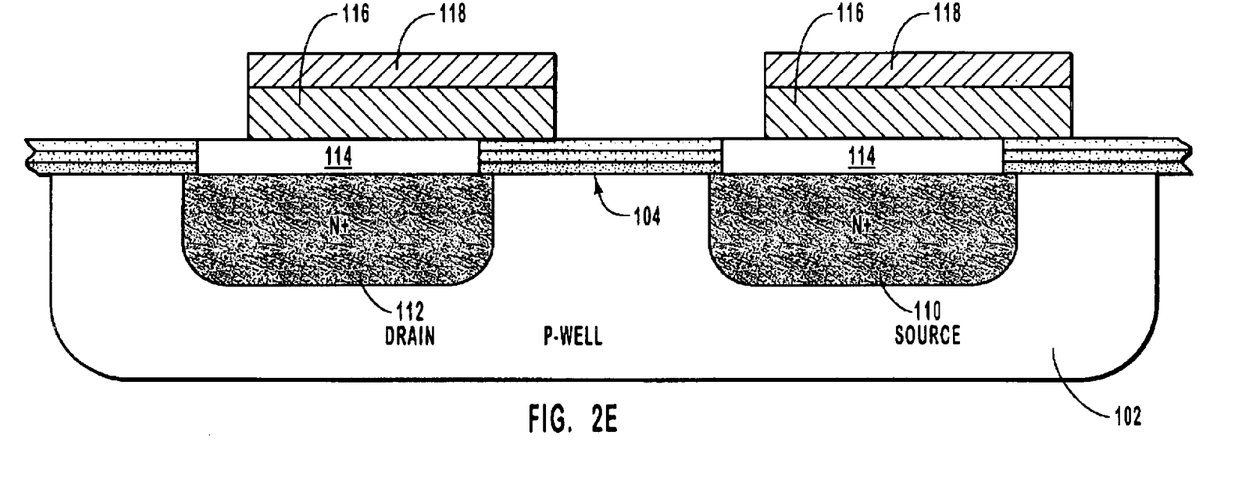
Figure 2F:
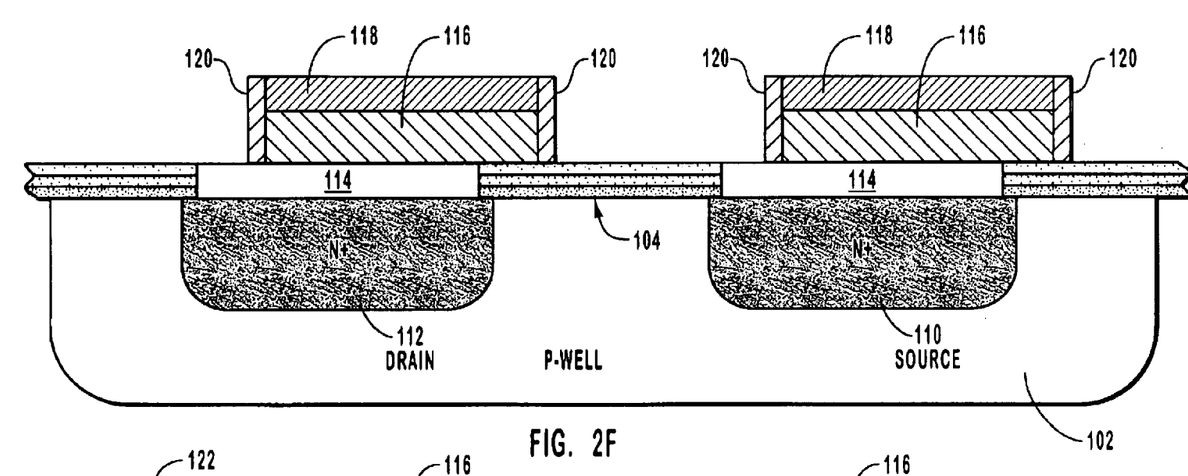
Figure 2G:
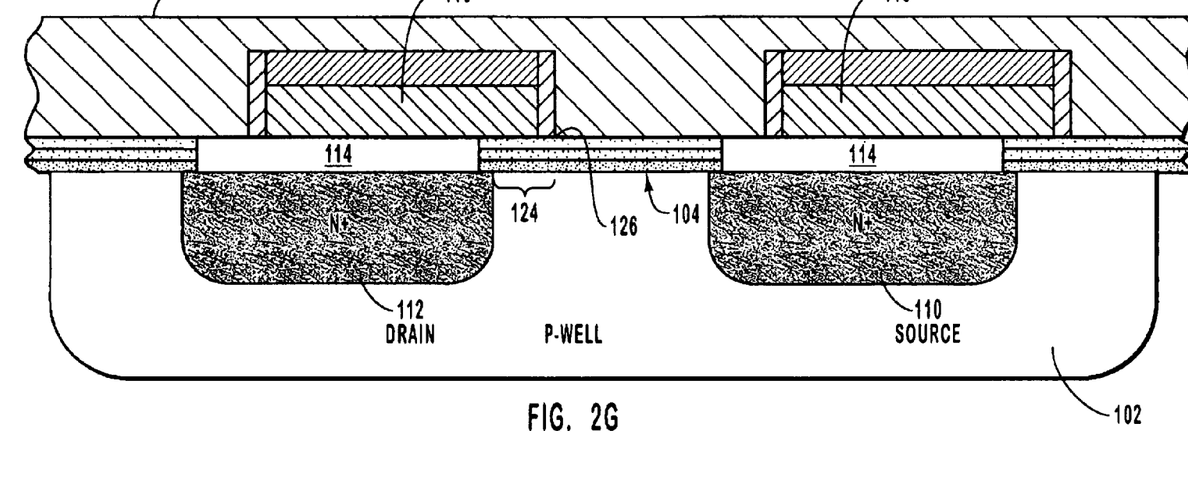

FIG. 2C depicts the further processing of source 110 and drain 112 through the application of a buried drain oxide 114 about the diffusion areas. FIG. 2D depicts the application of a polysilicon layer 116 with a follow-up nitride layer 118 about e entire memory cell region. As will be explained in further detail below. Polysilicon layer 116 is positioned to eventually provide a horizontal offset for a forhcoming gate (FIG. 2G), with respect to the drain 112 or source 110. As used herein. "Horizontal" is understood to mean a direction being parallel to the top planar surface of the su strate 100 (FIG. 2A). Through etching processes as seen in FIG. 2E, portions of polysicon layer 116 and nitride layer 118 remain and straddle portions of either source 110 or drain 112 and a portion of the ONO layer 104. As shown in FIG. 2F, oxide layers 120 are grown about the sides of polysilicon 116 and nitride 118 to provide appropriate insulation. In FIG. 2G of the present embodiment, an additional polysilicon layer 122 is deposited about the entire upper surface of the overall structure. This layer, gate polysilicon 122, provides the word line for an array of memory cell devices. As seen in FIG. 2G, the portion of the gate 122 overlying the ONO layer 104 is horizontally offset from the drain 112 a specified distance by the portions of the polysilicon layer 116 that remain as a result of the etching process described in connection with FIG. 2E. This horizontal spacing arrangement provided by the portions of the polysilicon layer 116 is discussed in further detail below.

It should be recalled that prior art memory devices have employed a ONO layer which extends significantly over the drain or source regions of a memory cell architecture. As such, the charge defining the logical state to be stored is trapped in the nitride layer of the ONO structure at a position within the nitride layer that is located on top of the drain or source region due to the location of the gate in relationship to the drain or source device. Because of the overlapping relationship with the ONO layer and the drain and gate configuration, an e-field was generated which was spread about the entire surface area that is common with the ONO layer and the drain or source region. As such, the intensity of the e-fields is directly proportional to such a common area between the gate and the drain or source regions. The e-field created between the regions which passes through the ONO layer causes the migration and trapping of charge within the nitride inner layer.

As shown in FIG. 2G, and in accordance with the present invention, the ONO layer 104 does not substantially overlap the source or drain regions of the semiconductor device. Additionally, the gate region of the structure, or in other words, gate polysilicon layer 122 is spaced about the drain and source regions so as to create an e-field path between the gate and the source or drain that does not involve a directly vertically overlapping arrangement. For example, as seen in FIG. 2G, the first polysilicon layer 116 provides a spacing arrangement for gate polysilicon 122, to be spaced a notable distance from the source or drain regions. For example, drain 112, as depicted in FIG. 2G, is spaced a physical distance 124 from gate polysilicon 122 due to the spacing functionality of polysilicon 116. This spacing distance 124 is traversed by ONO 104 between gate polysilicon 122 at a point 126 and drain 112. As such, the presence of a voltage differential between gate polysilicon 122 and drain 112 as separated by polysilicon 116 induces the trapping of electrons or holes within the nitride layer of ONO layer 104 between gate polysilicon 122 at a point 126 and drain 112. In a practical application of the present invention, polysilicon layer 116 may extend the length of drain 112 and be perpendicular to wordline gate polysilicon 122. Furthermore, polysilicon layer 116 may be coupled to drain 112 such that they may be biased similarly to drain 112 or, alternatively, polysilicon layer 116 may be coupled to a different potential for programming, erasing or reading.

It should be further evidenced that the generation of an e-field between gate polysilicon 122 and drain 112 occurs between a point 126 on gate polysilicon 122 and drain 112. The point or corner 126 on the gate 122 region induces a high e-field between the gate polysilicon 122 and drain 112. Such a phenomenon is termed herein "poly-edge discharge." Such an intense e-field due to the poly-edge discharge effect results in a more easily generated and trapped charge within the nitride layer of ONO layer 104 between gate polysilicon 122 at point 126 and drain 112. Therefore, such an increase in the e-field results in the ability to reduce the program and erasure voltages and current associated with the use of poly-edge discharge techniques. Such an improvement also facilitates an increased coupling ratio of up to 100% over traditional flash memory cells. Such a technique also positively impacts the program and erasure speeds due to the localization of the high $V_t$ region.

By way of example, the memory cell as depicted in FIG. 2G, may be programmed by placing drain 112 and polysilicon 116 at a potential of between 3 to 5 volts. The word line or gate polysilicon 122 is placed at a potential of between 0 and −5 volts. Such potentials allow for the injection of electrons from point 126 of gate polysilicon 122 into the nitride layer of ONO layer 104.

In order to erase the exemplary cell of FIG. 2G, the word line or gate polysilicon 122 is placed at a potential of between 3 to 5 volts with the P-well or the bulk region being placed at a potential of between 0 and −5 volts with all other contacts floating. The exemplary memory cell of the present invention may be read by placing drain 112 and polysilicon 116 at a potential of between 3 to 5 volts with the word line or gate polysilicon 122 being placed at a potential of between 3 to 5 volts with source 110 placed at 0 volts.

Figure 3:
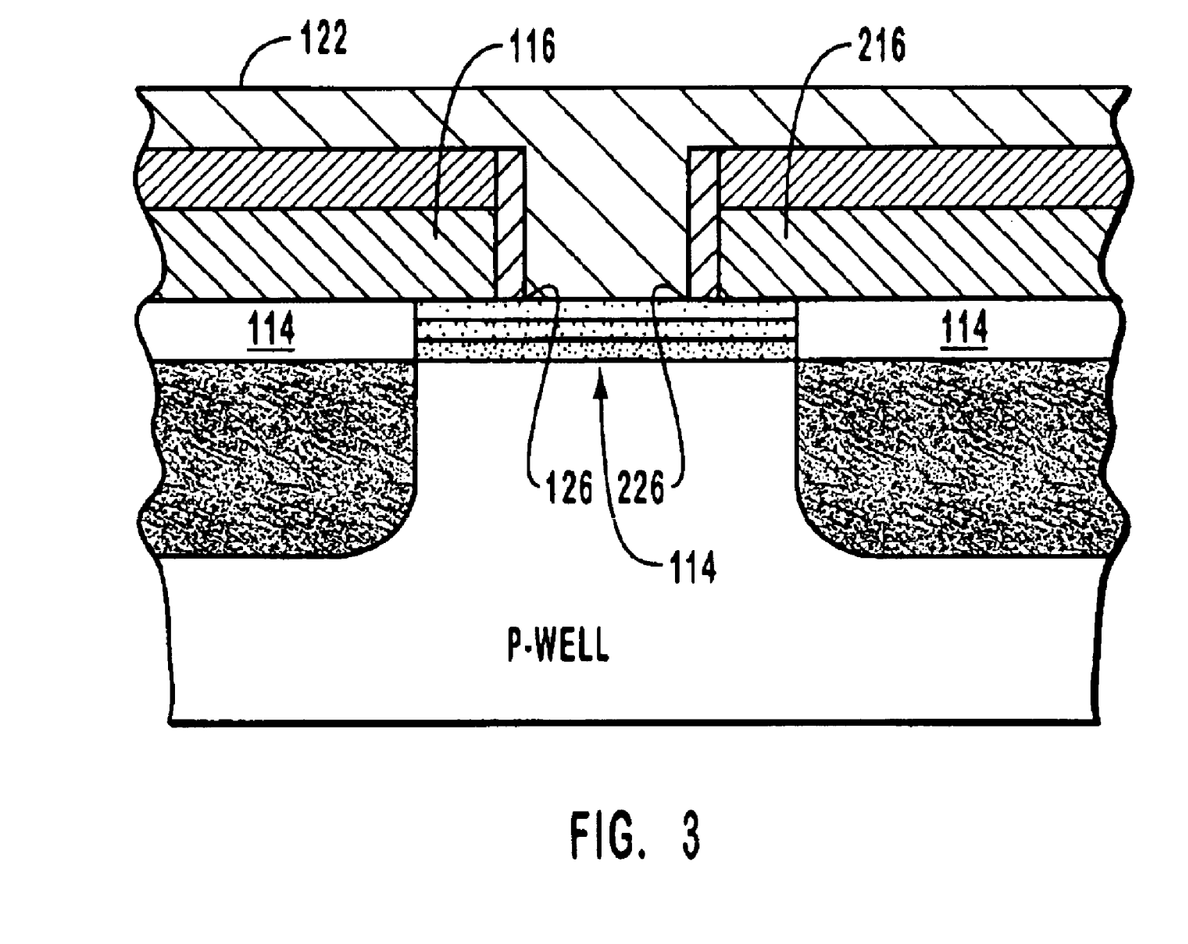
FIG. 3 depicts an alternate embodiment of a memory cell having a plurality of storage regions over a single channel area, in accordance with the present invention.

FIG. 3 illustrates an alternate embodiment exhibiting a two cell per channel structure, in accordance with an alternate embodiment of the present invention. In this embodiment, polysilicon 116 is duplicated in polysilicon 216 that facilitates increased densities through the placement of an additional point 226 on gate polysilicon 122.

Figure 4:
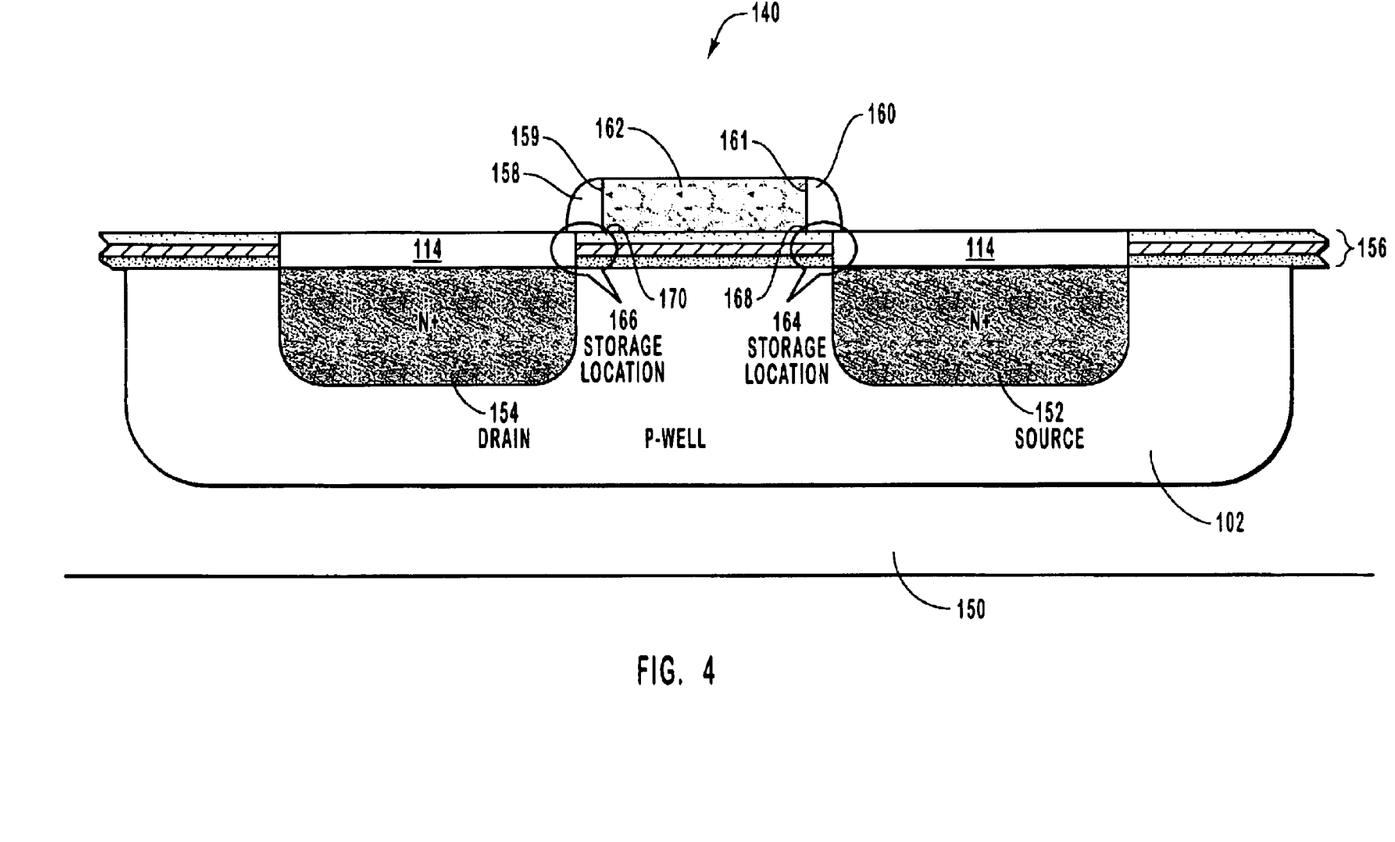
FIG. 4 depicts an alternate embodiment also employing poly-edge discharge for trapping charge in a charge trapping layer region adjacent to, rather than vertically over, the source and drain regions of the memory cell, in accordance with an alternate embodiment of the present invention.

FIG. 4 depicts an alternate embodiment of the memory cell of the present invention. In the present embodiment, a substrate 150 having a P-well 102 configuration is generated wherein a source 152 and a drain 154 are defused therein. Thereafter, on the top of substrate 150, an ONO layer 156 is deposited which is comprised, as described above, of an oxide/nitride/oxide composite capable of trapping or storing charge within the nitride layer.

A polysilicon gate 162 is formed upon ONO layer 156. Polysilicon or gate 162 is formed so as to be within the distance between source 152 and drain 154. As the present embodiment also employs poly-edge discharge techniques for enhancing the e-field for the storage of charges within the nitride layer, the polysilicon or gate 162 is spaced from the edges of the source and drain regions through the use of spacers 158 and 160 located on the edges or sidewalls 159, 161 of gate 162. Spacers 158, 160 provide lateral narrowing of polysilicon gate 162 such that the charge traverses laterally or sideways between a gate and either a source or drain. Also the spacers 158, 160 overlie portions of the ONO layer 156. The formation of non-conducting spacers 158 and 160 allow the formation of a storage region within the nitride layer as defined by storage regions 164 and 166 to be located substantially away from any vertical overlap areas of source 152 or drain 154.

Furthermore, consistent with the benefits of poly-edge discharge techniques, the program and erase voltages including the current for performing such functions may be reduced due to the enhanced e-field associated with the edges 168, 170 of gate 162 that most closely correspond to the respective sources and drains. Therefore, the storage of charge that facilitates the functionality of memory cell 140 is stored within the trapping or nitride layer of ONO 156 that is located in a region predominately lateral to rather than vertically above the source or drain regions. The present embodiment further facilitates the advantages of enhancing or improving the program and erase speeds because of the localized high $V_t$ region as well as the improved coupling ratio, up to 100%, over traditional flash memory cells.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for fabricating a non-volatile memory cell, comprising:

forming a source region and a drain region on a semiconductor substrate;

forming a charge trapping layer at least partially between said source and drain regions for trapping and retaining charge in a trapping region of said charge trapping layer and between said drain and source regions;

forming a gate on at least a portion of said charge trapping layer, said gate having an edge discharge portion being horizontally offset from one of said source and drain regions for inducing said charge with said one of said source and drain regions;

forming a first spacer on a first sidewall of said gate extending from said first sidewall of said gate toward one of said source and drain regions, said first spacer overlying a portion of said charge trapping layer; and forming a second spacer on a second sidewall of said gate extending from said second sidewall of said gate toward the other one of said source and drain regions, said first and second spacers and said gate extending between said source and drain regions.

2. The process for fabricating a non-volatile memory cell, as recited in claim 1, further comprising:

forming a first lateral spacer extending horizontally beyond one of said source and drain regions between said gate and said charge trapping layer for offsetting said edge discharge portion of said gate from said one of said source and drain regions.

3. The process for fabricating a non-volatile memory cell, as recited in claim 2, wherein said first lateral spacer is comprised of polysilicon insulated from said gate.

4. The process for fabricating a non-volatile memory cell, as recited in claim 1, wherein said first spacer is comprised of nonconductive oxide.

5. A process for fabricating a non-volatile memory cell, comprising:

forming a source region and a drain region on a semiconductor substrate having a channel therebetween;

forming a charge trapping layer over at least a portion of said channel;

forming a gate on said charge trapping layer between said source region and said drain region, said gate being shorter in length than the distance between said source region and said drain region; and forming a first spacer and a second spacer on opposing sidewalls of said gate, said first and second spacers and said gate extending between said source region and said drain region, at least said first spacer overlying a portion of said charge trapping layer.

6. The process for fabricating a non-volatile memory cell, as recited in claim 5, wherein said first spacer and said second spacer are comprised of nonconductive oxide material.

7. The process for fabricating a non-volatile memory cell, as recited in claim 5, wherein said charge trapping layer includes a bottom layer of silicon dioxide formed over said source region and said drain region, a layer of silicon nitride formed on said bottom silicon dioxide layer, and a top layer of silicon dioxide formed on said nitride layer.

8. A programmable memory cell, comprising:

a semiconducting substrate;

a source region doped to have a conductivity type opposite of said substrate;

a drain region spaced a distance from said source region forming a channel therebetween, said drain region doped to have a conductivity type opposite of said substrate;

a charge trapping layer extending between said source and drain regions for trapping and retaining charge in a trapping region between said drain and source regions;

a gate on at least a portion of said charge trapping layer, said gate having an edge discharge portion that is horizontally offset from of said source and drain regions for inducing said charge with said one of said source and drain regions for tapping at least a portion of said said charge in said charge trapping layer that is between said source and drain regions;

a first spacer on a first sidewall of said gate extending from said first sidewall of said gate toward one of said source and drain regions, said first spacer overlying at least a potion of said gate charge trapping layer; and a second spacer on a second sidewall of said gate extending from said second sidewall of said gate toward the one of said source and drain regions.

9. The programmable memory cell, as recited in claim 8, further comprising:

a first lateral spacer between said gate and said charge trapping layer for offsetting in a horizontal direction said edge discharge portion of said gate from said one of said source and drain regions.

10. The programmable memory cell, as recited in claim 9, wherein said first lateral spacer is comprised of polysicon insulated from said gate.

11. A programmable memory cell, comprising:

semiconducting substrate;

a source region doped to have a conductivity type opposite of said substrate;

a drain region spaced a distance from said source region forming a channel therebetween, said drain region doped to have a conductivity type opposite of said substrate;

a charge trapping layer extending between said source region and said drain region, said charge trapping layer for trapping and retaining charge in a first trapping region that is horizontally offset with respect to said source region and second trapping region that is horizontally offset with respect to said region;

a gate on at least a portion of said charge trapping layer, said gate having a first edge discharge portion that is horizontally offset with respect to said source region and a second edge discharge portion that is horizontally offset with respect to said drain region, said first and second edge portions for inducing charge with said source and drain regions for tapping in said first and second trapping regions in said trapping layer;

a first spacer on a first sidewall of said gate extending from said first sidewall of said gate toward one of said source and drain regions, said first spacer overlying a portion of said charge trapping layer; and a second spacer on a second sidewall of said gate extending from said second sidewall of said gate toward the one other one of said source and drain regions.

12. The programmable memory cell, as recited in claim 11, wherein said first spacer and said second spacer are comprised of nonconductive oxide material.

13. The programmable memory cell, as recited in claim 11, wherein said charge trapping layer includes a bottom layer of silicon dioxide formed over said source region and said drain region, a layer of silicon nitride formed on said bottom silicon dioxide layer, and a top layer of silicon dioxide formed on said nitride layer.

14. A programmable memory cell, comprising:

a semiconductor substrate having a specified conductive type;

a source region having a conductive type substantially opposite the conductivity type of the semiconducting substrate;

drain region having a conductivity type substantially opposite the conductivity a charge retention component disposed on the semiconducting substrate so as to be substantially interposed between said source and drain regions, the charge retention component comprising at least a bottom layer comprising silicon dioxide, a middle layer comprising silicon nitride, and a top layer comprising silicon dioxide, the charge retention component configured to retain a plurality of electrical charges within at least two trapping regions, each of the at least two trapping regions comprising a portion of the charge region component; and a gate overlying at least a portion of the charge retention component, the gate having at least two edge portions, each of the least two edge portions being disposed proximate one of the at least two trapping regions so as to induce the trapping of the plurality of electrical charges in the respective one of a first spacer located proximate another one at least two edge portions, said first spacer overlying a portion of said charge retentioncoponent; and a second spacer located proximate another one of the least two edge portions.

15. The programmable memory cell, comprising:

a semiconductor substrate having a specified conductive type;

a source region having a conductivity type substantially opposite the conductivity type of the semiconducting substrate;

a drain region having a conductivity type substantially opposite the conductivity type of the semiconducting substrate;

a charge retention component disposed on the semiconducting substrate so as to be substantially interposed between said source and drain regions, the charge retention component comprising at least a bottom layer comprising silicon dioxide, a middle layer comprising silicon nitride, and a top layer comprising silicon dioxide, the charge retention component configured to retain a plurality of electrical charges within a first trapping region, the first trapping region comprising a portion of charge retention component;

a gate overlying at least a portion of the charge retention component, the gate including a first sidewall;

a first insulating spacer disposed on the first sidewall, the first insulating spacer forming a first junction with both the first sidewall of the gate and the charge retention component at a position that is proximate the first trapping region so as to induce the trapping of the plurality of electrical charges in the first trapping region, the first insulating spacer overlying a first portion of the charge retention component;

a second trapping region defined in portion of the charge retention component; and a second insulating spacer disposed on a second sidewall of the gate, the second insulating spacer forming a second a junction with both the second sidewall of the gate and the charge retention component at a position that is proximate the second trapping region so as to induce the trapping of the plurality of electrical charges in the second trapping region, the second insulating spacer overlying a second portion of the charge retention component.

* * * * *

UNITED STATES PATENT AND TRADEMARK OFFICE
CERTIFICATE OF CORRECTION

PATENT NO. : 6,894,340 B2
DATED : May 17, 2005
INVENTOR(S) : Kuo et al.

It is certified that error appears in the above-identified patent and that said Letters Patent is hereby corrected as shown below:

Column 1,
Line 56, change "interrupted" to -- interpreted --.

Column 2,
Line 4, before "those employing" change "thin" to -- than --.
Line 31, after "maximized when" change "there" to -- their --.
Line 32, befoere "which occurs" insert -- maximized, --.

Column 3,
Line 8, change "laterally" to -- lateral --.
Line 12, after "region lateral" insert -- to, --.
Line 13, after "vertically above" insert -- , --.
Line 29, after "sidewall spacers" change "induces" to -- induce --.

Column 4,
Line 36, before "entire memory" change "e" to -- the --.
Line 37, change "below. Polysilicon" to -- below, polysilicon --.
Line 38, change "forhcoming" to -- forthcoming --.
Line 40, change "herein.; "Horizontal"" to -- herein, "horizontal" --.
Line 41, change "su strate" to -- substrate --.

Column 6,
Line 28, before "the formation" change "allow" to -- allows --.
Line 40, change predominately" to -- predominantly --.
Line 64, before "between said drain" remove "and".

Column 7,
Line 65, after "offset from" insert -- one --.

UNITED STATES PATENT AND TRADEMARK OFFICE
CERTIFICATE OF CORRECTION

PATENT NO. : 6,894,340 B2
DATED : May 17, 2005
INVENTOR(S) : Kuo et al.

It is certified that error appears in the above-identified patent and that said Letters Patent is hereby corrected as shown below:

Column 8,
Line 6, change "potion" to -- portion --.
Line 9, before "one of said" insert -- other --.
Line 20, before "semiconducting" insert -- a --.
Line 31, before "second trapping region" insert -- a --.
Line 32, before "region;" insert -- drain --.
Line 39, change "tapping" to -- trapping --.
Line 58, after "specified" change "conductive" to -- conductivity --.
Line 60, before "substantially" change "conductive" to -- conductivity --.
Line 63, before "drain region" insert -- a --.
Line 64, after "opposite the conductivity" add the following missing phrase:
-- type of the semiconducting substrate; --.

Column 9,
Line 15, after "respective one of" insert the following missing phrase:
-- the at least two trapping regions; --.
Line 16, after "another one" insert -- of the --.
Line 18, change "retentioncoponent;" to -- retention component; --.
Line 21, before "programmable" change "The" to -- A --.
Line 22, change "semiconductor" to -- semiconducting --.
Line 22, after "specified" change "conductive" to -- conductivity --.

Column 10,
Line 19, before "portion of the charge" change "in" to -- a --.
Line 23, before "junction" remove "a".

Signed and Sealed this

Twenty-ninth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,894,340 B2
APPLICATION NO. : 09/861284
DATED : May 17, 2005
INVENTOR(S) : Kuo et al.

It is certified that error appears in the above-identified patent and that said Letters Patent is hereby corrected as shown below:

Column 1,
Line 56, change "interrupted" to --interpreted--

Column 2,
Line 4, before "those employing" change "thin" to --than--
Line 31, after "maximized when" change "there" to --their--
Line 32, before "which occurs" insert --maximized,--

Column 3,
Line 8, change "laterally" to --lateral--
Line 12, after "region lateral" insert --to,--
Line 13, after "vertically above" insert --,--
Line 29, after "sidewall spacers" change "induces" to --induce--

Column 4,
Line 36, before "entire memory" change "e" to --the--
Line 37, change "below. Polysilicon" to --below, polysilicon--
Line 38, change "forhcoming" to --forthcoming--
Line 40, change "herein.; "Horizontal"" to --herein, "horizontal"--
Line 41, change "su strate" to --substrate--

Column 6,
Line 28, before "the formation" change "allow" to --allows--
Line 40, change "predominately" to --predominantly--
Line 64, before "between said drain" remove [and]

Column 7,
Line 65 claim 8, after "offset from" insert --one--

Column 8,
Line 6 claim 8, change "potion" to --portion--
Line 9 claim 8, before "one of said" insert --other--
Line 20 claim 11, before "semiconducting" insert --a--
Line 31 claim 11, before "second trapping region" insert --a--
Line 32 claim 11, before "region;" insert --drain--
Line 39 claim 11, change "tapping" to --trapping--
Line 58 claim 14, after "specified" change "conductive" to --conductivity--
Line 60 claim 14, before "type substantially" change "conductive" to --conductivity--
Line 63 claim 14, before "drain region" insert --a--
Line 64 claim 14, after "opposite the conductivity" add the following missing phrase:
   --type of the semiconducting substrate;--

UNITED STATES PATENT AND TRADEMARK OFFICE
CERTIFICATE OF CORRECTION

PATENT NO. : 6,894,340 B2
APPLICATION NO. : 10/317789
DATED : May 17, 2005
INVENTOR(S) : Kuo et al.

It is certified that error appears in the above-identified patent and that said Letters Patent is hereby corrected as shown below:

Column 9,
Line 15 claim 14, after "respective one of" insert the following missing phrase:
   --the at least two trapping regions;--
Line 16 claim 14, after "another one" insert --of the--
Line 18 claim 15, change "retentioncoponent;" to --retention component;--
Line 21 claim 15, before "programmable" change "The" to --A--
Line 22 claim 15, change "semiconductor" to --semiconducting--
Line 22 claim 15, after "specified" change "conductive" to --conductivity--

Column 10,
Line 19 claim 15, before "portion of the charge" change "in" to --a--
Line 23 claim 15, before "junction" remove [a]

Signed and Sealed this

Nineteenth Day of February, 2008

JON W. DUDAS
*Director of the United States Patent and Trademark Office*